(12) United States Patent
Hu et al.

(10) Patent No.: US 8,514,088 B2
(45) Date of Patent: Aug. 20, 2013

(54) TEMPERATURE CONTROL SWITCH, METHOD FOR USING THE SAME AND ALARM SYSTEM USING THE SAME

(75) Inventors: Chun-Hua Hu, Beijing (CN);
Chang-Hong Liu, Beijing (CN);
Shou-Shan Fan, Beijing (CN)

(73) Assignees: Tsinghua University, Beijing (CN);
Hon Hai Precision Industry Co., Ltd., New Taipei (TW)

( * ) Notice: Subject to any disclaimer, the term of this patent is extended or adjusted under 35 U.S.C. 154(b) by 362 days.

(21) Appl. No.: 12/911,905

(22) Filed: Oct. 26, 2010

(65) Prior Publication Data
US 2011/0181424 A1  Jul. 28, 2011

(30) Foreign Application Priority Data
Jan. 22, 2010 (CN) .......................... 2010 1 0102314

(51) Int. Cl.
*G08B 17/00* (2006.01)
(52) U.S. Cl.
USPC .............................. 340/584; 340/657; 73/766

(58) Field of Classification Search
USPC ...................... 340/657, 584; 73/766; 338/25, 338/29
See application file for complete search history.

(56) References Cited

U.S. PATENT DOCUMENTS

| | | | | |
|---|---|---|---|---|
| 5,695,859 A * | 12/1997 | Burgess | ........................ | 340/973 |
| 6,717,568 B1 * | 4/2004 | Takatuka et al. | .............. | 345/156 |
| 7,567,740 B2 * | 7/2009 | Bayindir et al. | .............. | 385/101 |
| 7,594,442 B2 * | 9/2009 | Kaiserman et al. | ............. | 73/760 |
| 7,647,837 B2 * | 1/2010 | Moran et al. | ..................... | 73/766 |
| 7,857,626 B2 * | 12/2010 | Toly | .............................. | 434/267 |
| 8,175,821 B2 * | 5/2012 | Nagakubo et al. | .............. | 73/763 |

* cited by examiner

*Primary Examiner* — John A Tweel, Jr.
(74) *Attorney, Agent, or Firm* — Altis Law Group, Inc.

(57) ABSTRACT

The present disclosure relates to a temperature control switch. The temperature control switch includes a bistable resistance element. The bistable resistance element includes a low-conductivity matrix; and a number of high conductivity particles dispersed in the matrix. The bistable resistance element switches from a low resistance state to a high resistance state by receiving a temperature change applied to the bistable resistance element. The present disclosure also relates to a method for using the temperature control switch and an alarm system.

19 Claims, 9 Drawing Sheets

TEMPERATURE CONTROL SWITCH, METHOD FOR USING THE SAME AND ALARM SYSTEM USING THE SAME

CROSS-REFERENCE TO RELATED APPLICATIONS

This application claims all benefits accruing under 35 U.S.C. §119 from China Patent Application No. 201010102134.6, filed on Jan. 22, 2010 in the China Intellectual Property Office, the contents of which are hereby incorporated by reference. This application is related to a commonly-assigned application entitled, "PRESSURE CONTROL SWITCH, METHOD FOR USING THE SAME AND ALARM SYSTEM USING THE SAME," 12/911897, filed Oct. 26, 2010.

BACKGROUND

1. Technical Field

The present disclosure relates to temperature control switches, methods for using the same, and alarm systems using the same.

2. Description of Related Art

Temperature control switches not only sense temperature changes of the surrounding environment, but also switch from an off state to an on state if the temperature is larger or smaller than a desired value, and maintains the on state even if the temperature changes back to an acceptable value. The temperature control switches have been utilized in many fields where temperature changes are to be monitored, such as reaction furnaces, electronic devices, and vaccine incubators.

However, to maintain the on state of the temperature control switches, logical operation chips or circuits with complicated logical operating elements are used in the temperature control switches, to accompany the temperature sensors. The temperature sensors send temperature signals to the chips or circuits. The chips or circuits compare values of the temperature signals with desired values to switch and maintain the on and off states of the temperature control switches.

What is needed, therefore, is to provide a temperature control switch having a simpler structure, a method for using the same, and an alarm system using the same.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another", "an", or "one" embodiment in this disclosure are not necessarily to the same embodiment, and such references mean at least one.

One embodiment of a temperature control switch includes a bistable resistance element. The bistable resistance element has two switchable stable resistance states: a high resistance state and a low resistance state, and the two states are convertible with each other. At the high resistance state, the bistable resistance element has a high resistance. At the low resistance state, the bistable resistance element has a low resistance. The bistable resistance element switches from the high resistance state to the low resistance state when receiving an electric signal applied to the bistable resistance element. The electric signal can be at least one of a current, a voltage, and an electric field having a sufficient value to convert the bistable resistance element from the high resistance state to the low resistance state. The bistable resistance element switches from the low resistance state to the high resistance state by simply having a temperature change of the bistable resistance element. The temperature change has a sufficient value to convert the bistable resistance element from the low resistance state to the high resistance state. The temperature change can be an increase or a decrease of the temperature. That is, the temperature control switch is bidirectional. The switch occurs from a low resistance state to a high resistance state when the temperature both increases and decreases. A ratio of the high resistance to the low resistance of the bistable resistance element may be equal to or larger than about 50:1 to about 100:1. In one embodiment, the ratio is in a range from about 1,000:1 to about 10,000:1.

Figure 1:
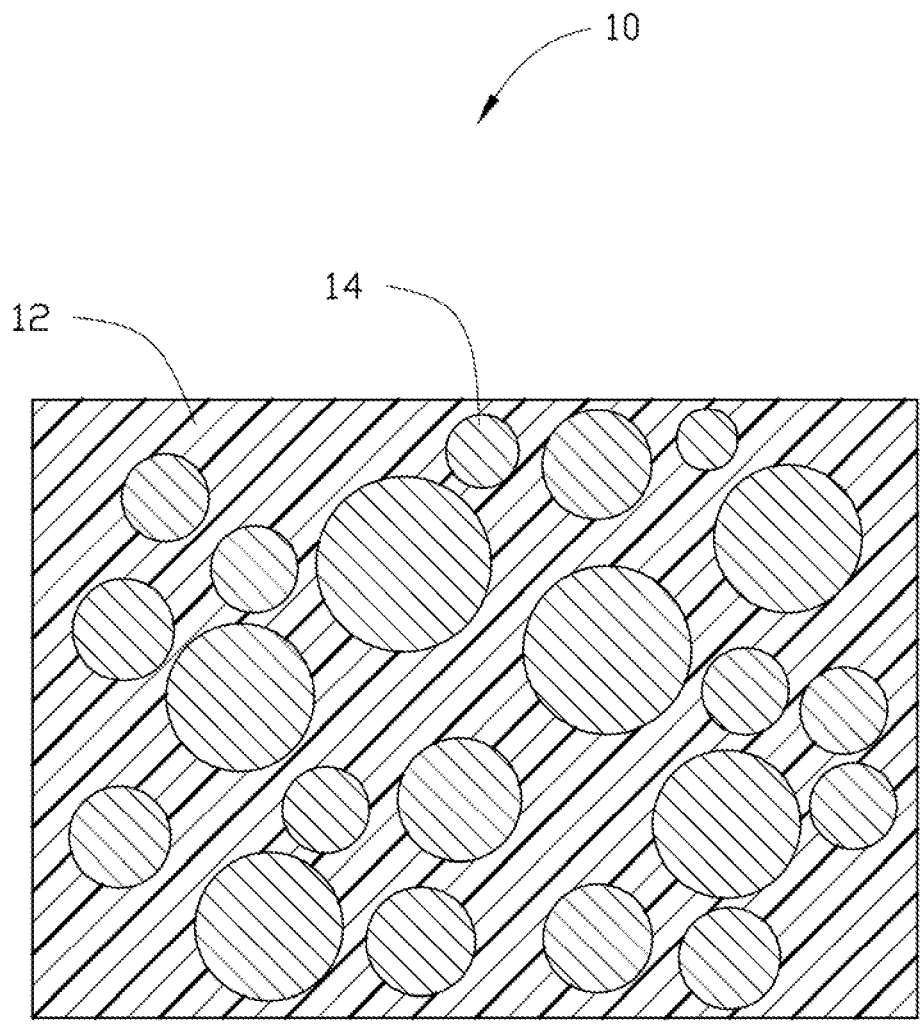
FIG. 1 is a structure view of an embodiment of a bistable resistance element of a temperature control switch.

Referring to FIG. 1, a bistable resistance element 10 includes a soft organic low-conductivity matrix 12, and a sufficient amount of high conductivity particles 14 dispersed in the matrix 12 to render the bistable resistance element 10 switchable between the low resistance state and the high resistance state.

The high conductivity particles 14 can be metal particles. The material of the metal particles can be pure metals and/or metal alloys, such as gold, silver, tin, nickel, iron, copper, or platinum. The diameter of the metal particles can be in a range from about 1 nanometer to about 100 microns. In one embodiment, the diameter of the metal particles is in a range from about 2 nanometers to about 20 microns. A volume percent of the metal particles in the bistable resistance element 10 can be in a range from about 5% to about 40%. In one embodiment, the volume percent of the metal particles in the bistable resistance element 10 is in a range from about 9% to about 11%. The material, diameter, and volume percent in the bistable resistance element 10 of the high conductivity particles 14 affect the sensitivity of the bistable resistance element 10 and can be set as desired. The filaments can be formed and connected by receiving the electric signal, and broken or isolated by receiving the temperature change.

The organic, soft, low-conductivity matrix 12 carries and supports the plurality of metal particles, and has a sufficient responsive volume expansion or contraction according to the temperature change thereof, enabling the breakage or isolation of the filaments. When the volume of the matrix 12 expands caused by heat, the filaments may be broken or isolated to each other. When the volume of the matrix 12 contracts caused by cooling, the filaments may be pressed to break. The matrix 12 may be an elastic or flexible insulating material. The material of the matrix 12 can be a polymer such as elastomers, silicone rubbers, polyethylene glycol (PEG), polypropylene (PP), polyesters, epoxy resins, hypoxia glues, and acrylic resins. The matrix 12 expands and contracts with the temperature. The matrix 12 can have a high or low coefficient of thermal expansion (CTE), which can be set as a desired range of working temperature. The lower the CTE, the broader the working temperature range of the switch, and vice versa. A ratio of the CTE of the metal particles to the CTE of the matrix 12 may be equal to or larger than 40:1.

Figure 2:
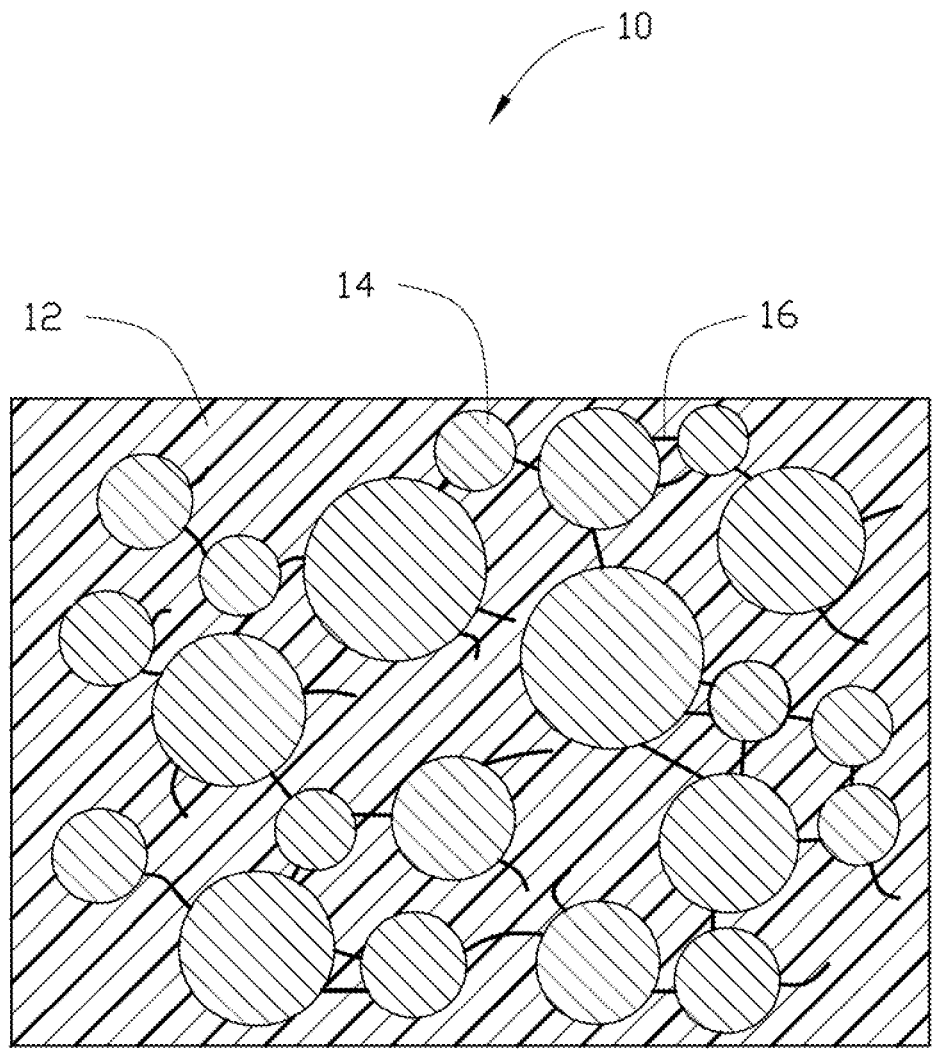
FIG. 2 is a structure view of an embodiment of the bistable resistance element having electrical conducting paths therein.

Referring to FIG. 2, at the low resistance state, the bistable resistance element 10 further includes a plurality of high conductivity filaments 16 extending from surfaces of the high conductivity particles 14 formed by applying the electric signal to the bistable resistance element 10. The high conductivity filaments 16 are grown from the high conductivity particles 14. The material of the high conductivity filaments 16 can be pure metals and/or metal alloys corresponding to the material of the metal particles. The high conductivity filaments 16 may have a diameter of about 1 nanometer to about 100 nanometers, and a length of about 0.1 microns to about 100 microns. The high conductivity filaments 16 extending from one high conductivity particle may be in contact with the high conductivity filaments 16 extending from other high conductivity particles 14 and/or directly contacting with other high conductivity particles 14. Electrical conducting paths are formed between the high conductivity particles 14 by the high conductivity filaments 16. Thus, an electrical conducting network is formed in the bistable resistance element 10 including both the high conductivity particles 14 and the high conductivity filaments 16 electrically connecting the high conductivity particles 14 together. Therefore, the bistable resistance element 10 having the high conductivity filaments 16 is at the low resistance state.

Figure 3:
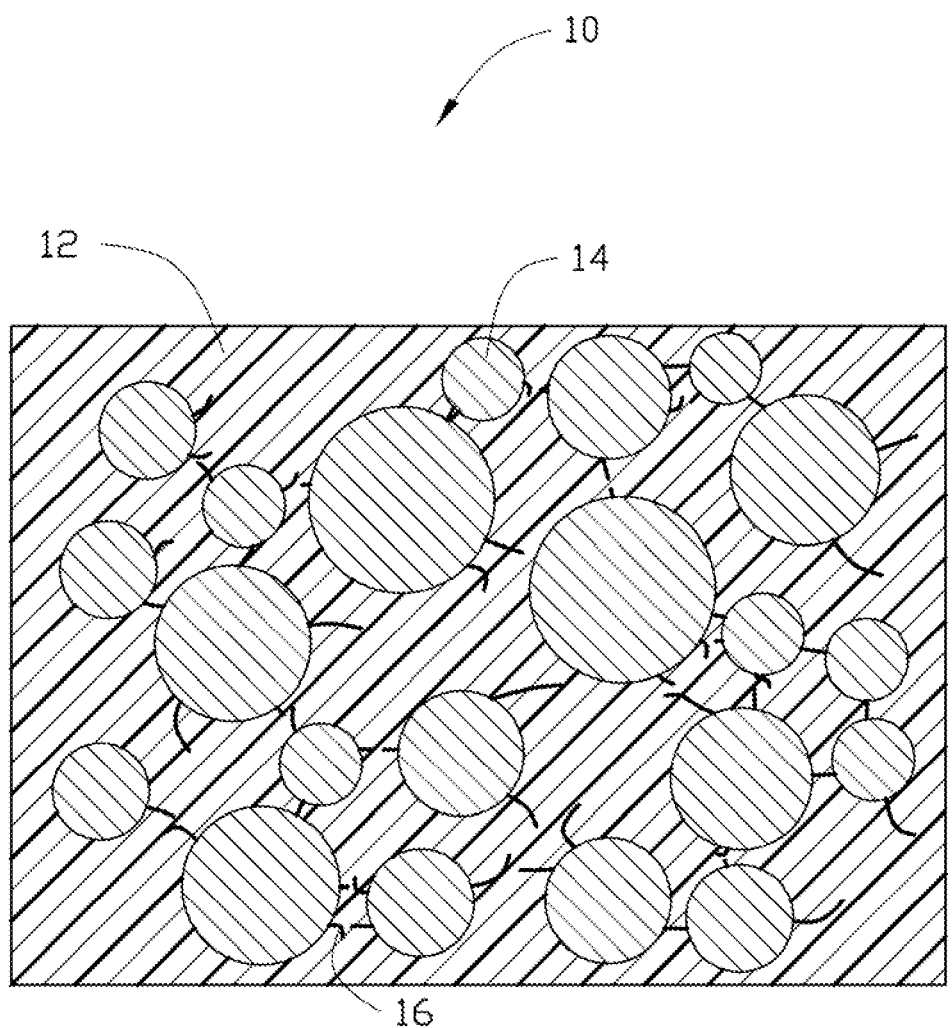
FIG. 3 is a structure view of an embodiment of the bistable resistance element having broken filaments therein.

Referring to FIG. 3, at the high resistance state, at least some of the high conductivity filaments 16 are isolated or broken by the expansion or contraction of the matrix 12, thus electrically disconnecting the high conductivity particles 14. The expansion or contraction may be by shape and/or size of the matrix 12. For example, the matrix 12 can be heated or cooled. The expansion or contraction may not occur externally in the shape and/or size of the matrix 12, but may occur inside the matrix 12. In one embodiment, the expansion or contraction of the matrix 12 changes the relative positions and/or relative distances among the high conductivity particles 14, thereby isolating or breaking at least some of the filaments 16. The greater the temperature change, the greater the expansion or contraction of the matrix 12, and the greater the resistance change of the bistable resistance element 10.

The expansion or contraction may occur at any time if the bistable resistance element 10 is at the low resistance state, and once the sufficient expansion or contraction successfully isolates or breaks at least some of the filaments 16, the bistable resistance element 10 switches to the high resistance state. The expansion or contraction can be caused by the temperature change of the matrix 12. The temperature change (i.e., $\Delta T$) is a change from one temperature value to another temperature value of the bistable resistance element 10. If the $\Delta T$ is larger than or equal to a critical value (i.e., $\Delta T_{min}$), the $\Delta T$ is sufficient to produce the expansion or contraction to isolate or break the at least some of the filaments 16, and thus switch the bistable resistance element 10 from a low resistance state to a high resistance state. During the switch from the low resistance state to the high resistance state, the temperature change can be determined by the following equation, $\Delta T = |TV_{high} - TV_{low}| \geq \Delta T_{min}$, wherein $TV_{low}$ is the temperature value of the bistable resistance element 10 at the low resistance state, and $TV_{high}$ is the temperature value of the bistable resistance element 10 at the high resistance state. The filaments 16 are formed at the $TV_{low}$. At least some of the filaments 16 are isolated or broken if the $TV_{low}$ is changed to the $TV_{high}$. In one embodiment, the filaments 16 are formed under a $TV_{low}$ of about 20° C., and isolated or broken if the temperature of the bistable resistance element 10 is changed from the $TV_{low}$ of about 20° C. to a $TV_{high}$ of about 15° C., the sufficient $\Delta T$ being about 5° C.

It is to be understood that the filaments 16 can be formed under a room temperature (e.g., in a range from about 15° C. to about 30° C.), and for different switches, the $TV_{low}$ can have the same or different values. In one embodiment, the bistable resistance element 10 can be located in a hot or cold circumstance when the filaments 16 are formed to achieve a higher or lower $TV_{low}$. No matter the value of the $TV_{low}$, if the temperature changes to achieve the sufficient expansion or contraction, the filaments 16 would be isolated or broken.

The bistable resistance element 10 may switch between the high resistance state and the low resistance state more than once with different $TV_{high}$ and different $TV_{low}$. For example, the bistable resistance element 10 first switches from the low resistance state to the high resistance state when the $TV_{low}$ is about 20° C. and the $TV_{high}$ is about 15° C. At the temperature of 15° C., the electric signal can be applied to the bistable resistance element 10 to switch the high resistance state back to the low resistance state. Therefore, the $TV_{low}$ is about 15° C. when the bistable resistance element 10 is switched back to the low resistance state. The $TV_{low}$ is determined by the temperature value of the bistable resistance element 10 when the filaments 16 are formed by the electric signal, and can have different values at different switches. For different $TV_{low}$, the bistable resistance element 10 may have different sufficient $\Delta T$.

The temperature change can be made by any suitable means, such as a temperature excitation element such as a heater or cooler, a test apparatus such as an electronic device, a specimen, a human body, or a particular circumstance (e.g., a reaction furnace and a vaccine incubator) which has the bistable resistance element 10 therein. For example, the temperature change can be induced by a light source irradiated to the bistable resistance element 10.

The high resistance of the bistable resistance element 10 at the high resistance state is caused by the physical isolation between the adjacent filaments 16 or mechanical breakage of the filaments 16 (i.e., mechanical disconnection between the high conductivity particles 14). Therefore, the bistable resistance element 10 can never switch to the low resistance state until a sufficient electric signal is applied to the bistable resistance element 10 and new filaments 16 are formed from the surfaces of the high conductivity particles 14 in the matrix 12. The temperature change can be a momentary signal. If the $TV_{high}$ is changed back to equal the $TV_{low}$ after at least some of the filaments 16 are isolated or broken, the high resistance state would not switch to the low resistance state. That is to say, the bistable resistance element 10 maintains its current state unless a sufficient electric signal is applied to the bistable resistance element 10 to renew the bistable resistance element 10 and switch the bistable resistance element 10 from the high resistance state to the low resistance state.

The bistable resistance element 10 may have an initial state in which the conductivity filaments 16 may not have been formed in the bistable resistance element 10 and a majority of the high conductivity particles 14 are electrically separated from each other in the matrix 12. Thus, the bistable resistance element 10 would have a high resistance.

Figure 4:
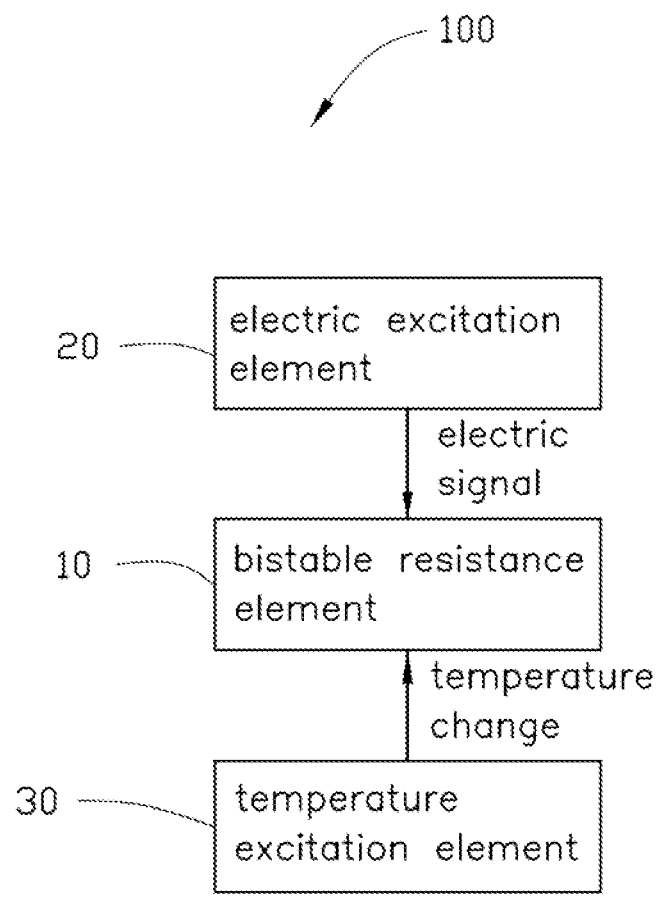
FIG. 4 is a schematic view of an embodiment of a temperature control switch.

Referring to FIG. 4, a temperature control switch 100 may further include an electric excitation element 20, and/or a temperature excitation element 30.

The electric excitation element 20 is to produce the electric signal, such as the current, voltage, and electric field applied to the bistable resistance element 10. The intensity of the electric filed may be in a range from about 0.1 volt per millimeters (V/mm) to about 100 V/mm. The bistable resistance element 10 may be disposed in the electric field produced by the electric excitation element 20. In one embodiment, the electric excitation element 20 may be a plate capacitor. The bistable resistance element 10 is located between two plates of the plate capacitor. In another embodiment, the electric excitation element 20 may be electrically connected to the bistable resistance element 10 to electrically conduct the current and voltage to the bistable resistance element 10.

The electric excitation element 20 may be an electric pulse signal producing device, the electric signal being a pulse electric field having a width of about 1 millisecond to about 10 seconds and an intensity of about 0.3 V/mm to about 3 V/mm.

The temperature excitation element 30 conducts heat to the bistable resistance element 10 thereby causing a temperature change of the bistable resistance element 10. The temperature excitation element 30 can be a test object such as a human body, a cooler, a heater, a specimen, a device, a liquid, a circumstance such as a room, or a sealed container having a gas therein.

Figure 5:
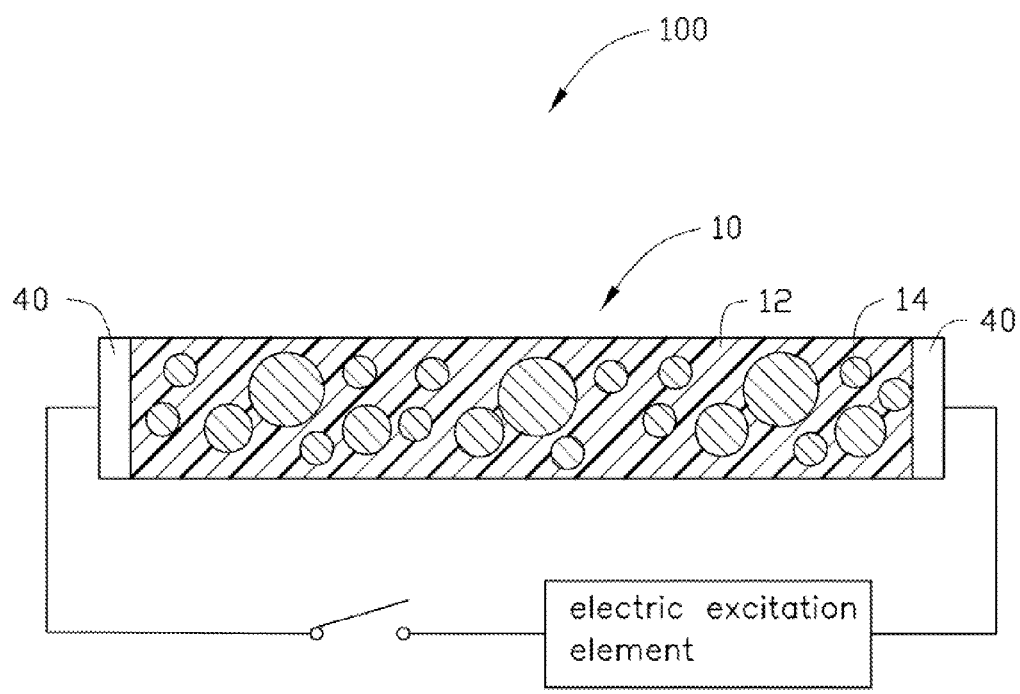
FIG. 5 is a schematic view of another embodiment of the temperature control switch.

Referring to FIG. 5, the temperature control switch 100 may further include two electrodes 40 electrically connecting the electric excitation element 20 to the bistable resistance element 10. The two electrodes 40 may be located on opposite surfaces of the bistable resistance element 10. The material of the two electrodes 40 can be at least one of metals, conducting resins, and carbon nanotubes. In one embodiment, the material of the two electrodes 40 is silver paste. The distance between the two electrodes 40 can be set as desired. The two electrodes 40 can be located on two opposite sides of the longest axis of the bistable resistance element 10.

The bistable resistance element 10 of the temperature control switch 100 switches between the high resistance state and the low resistance state by using the electric signal and the temperature change applied thereto. The temperature control switch 100 does not need a complicated electrical circuit to switch and hold the on and off states, but uses temperature changes to affect the resistance of the bistable resistance element 10, thereby accomplishing the function of the switch. The temperature change can switch and hold the bistable resistance element 10 at the high resistance state until the bistable resistance element 10 is renewed to the low resistance state by the electric signal. The temperature control switch 100 has a simpler structure and can be used in many fields to detect and monitor temperature change.

A method for using the temperature control switch 100 includes steps of:

S101, providing the bistable resistance element 10;

S102, applying the electric signal to the bistable resistance element 10 to set the bistable resistance element 10 at the low resistance state; and S103, sensing the temperature change by switching the low resistance state to the high resistance state of the bistable resistance element 10.

In step S102, the bistable resistance element 10 is located in a working place having a working temperature (i.e., $TV_{low}$). Under this working temperature, the electric signal is applied to the bistable resistance element 10 to grow the filaments 16 in the matrix 12.

In step S103, if the temperature change of the working place is larger than or equal to the $\Delta T_{min}$, the filaments 16 are at least partially isolated or broken, to switch the bistable resistance element 10 to the high resistance state. An additional step of renewing the bistable resistance element 10 by applying the electric signal to the bistable resistance element 10 to switch the bistable resistance element 10 from the high resistance state to the low resistance state can be further processed after step S103. The working temperature can be room temperature.

Figure 6:
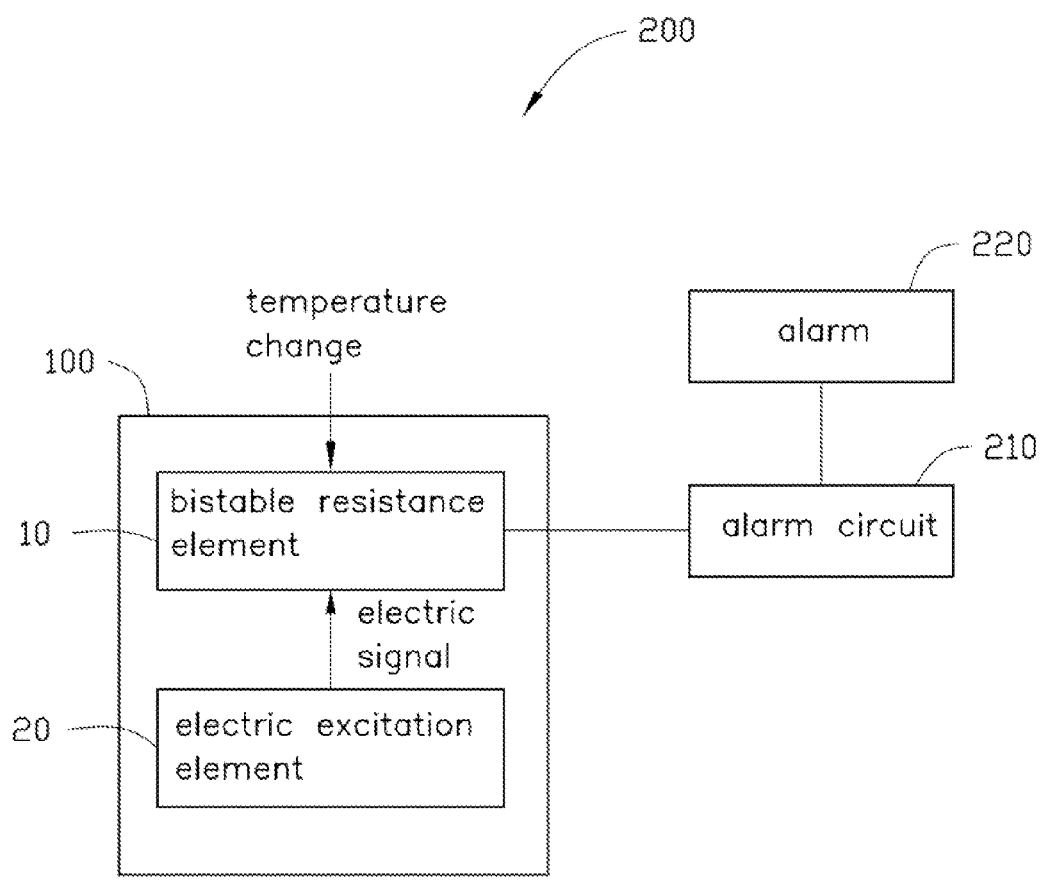
FIG. 6 is a schematic view of an embodiment of an alarm system.

Referring to FIG. 6, an alarm system 200 includes the temperature control switch 100, an alarm circuit 210, and an alarm 220. The temperature control switch 100 and the alarm 220 are electrically connected with the alarm circuit 210. The temperature control switch 100 may include the bistable resistance element 10 and the electric excitation element 20. When the bistable resistance element 10 is at the high resistance state, the alarm circuit 210 powers the alarm 220. The bistable resistance element 10 can be renewed by the electric excitation element 20.

EXAMPLE 1

The temperature control switch of example 1 includes the bistable resistance element, two electrodes, and electric excitation element, is assembled and is tested. In the bistable resistance element, the material of the matrix is polydimethyl siloxane (PDMS), and the material of the metal particles is nickel. The CTE ratio of the PDMS to the nickel particles is equal to or larger than 40:1. The diameter of the nickel particles is from about 1 micron to about 6 microns. The volume percentage of the nickel particles in the bistable resistance element is in a range from about 9% to about 11%.

The bistable resistance element has a rectangular layer shape and is disposed on a surface of a glass board. The two electrodes are silver paste layers formed on two side surfaces of the bistable resistance element.

The electric excitation element is a pulsed power source. The electric signals are electric pulses produced by the pulsed power source. The electric excitation element is electrically connected with the two electrodes through conducting wires. The electric pulses are applied to the bistable resistance element by the two electrodes to grow the filaments in the matrix. Thus, the bistable resistance element is switched from the initial state to the low resistance state.

Figure 7:
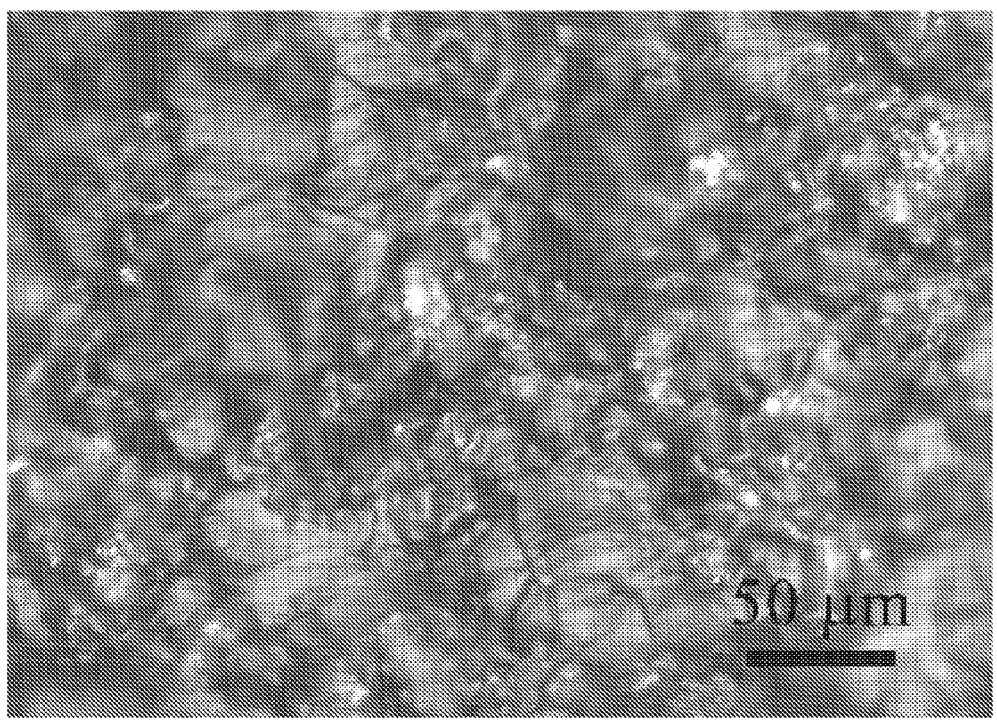
FIG. 7 is a high resolution optical photograph showing a cross section of an embodiment of the bistable resistance element on low resistance state.

Referring to FIG. 7, the filaments can be seen on the photo of the cross section of the bistable resistance element at a low resistance state. The filaments are grown from the nickel particles and contact each other to electrically connect the nickel particles therebetween.

Figure 8:
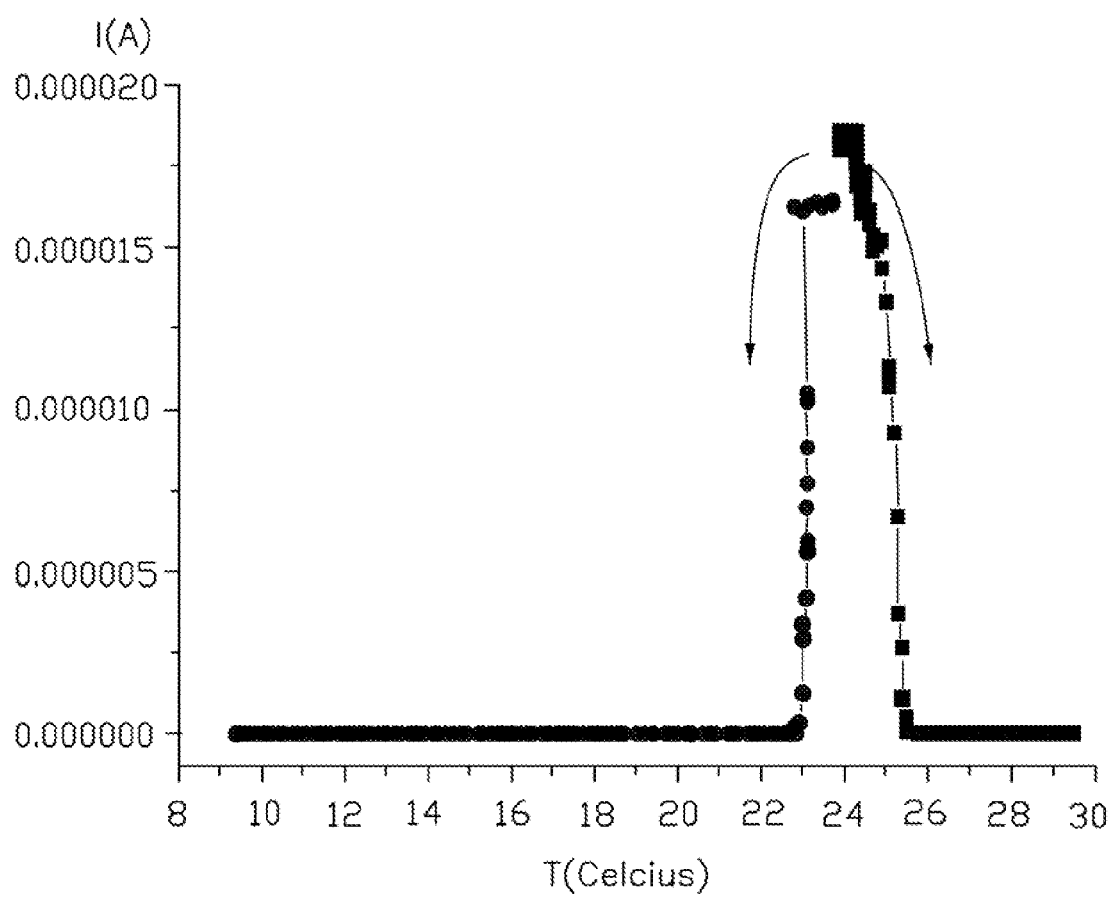
FIG. 8 is a graph showing current varying with temperature of the temperature control switch having a low resistance state at about 24° C.

Referring to FIG. 8, the bistable resistance element having the $TV_{low}$ of about 24° C. is electrically conducted in a circuit, and the temperature of the bistable resistance element is increased and decreased respectively two times in the test. The vertical axis of the FIG. 8 represents the current through the bistable resistance element, and the horizontal axis of the FIG. 8 represents temperature. As the bistable resistance element is heated or cooled for greater than about 1.4° C. (i.e., the $\Delta T_{min}$ is about 1.4° C.), the current of the bistable resistance element dramatically decreases from about 0.015 mA to 0, and the bistable resistance element switches to the high resistance state.

EXAMPLE 2

Figure 9:
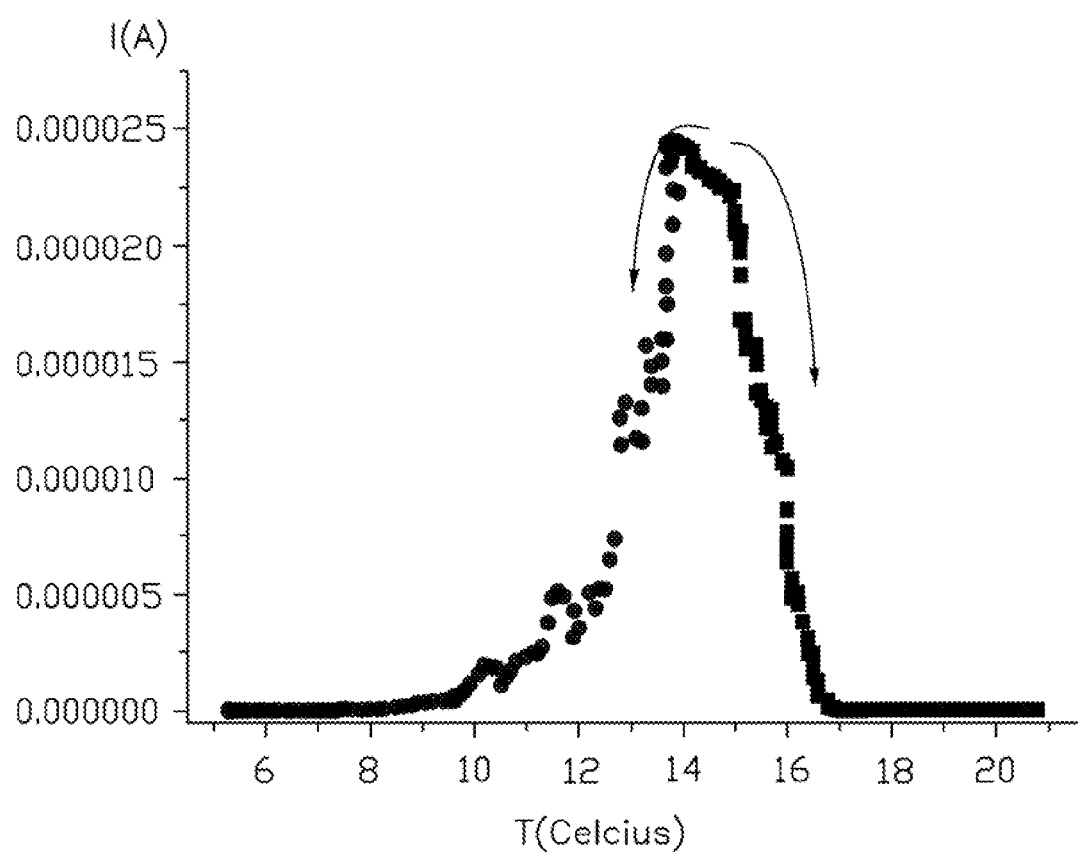
FIG. 9 is a graph showing current varying with temperature of the temperature control switch having a low resistance state at about 14° C.

The temperature control switch of Example 2 is the same as in Example 1. However, the $TV_{low}$ of the bistable resistance element is about 14° C. Referring to FIG. 9, two tests are performed to increase and decrease the temperature of the bistable resistance element from 14° C. When the temperature increase and temperature decrease are greater than about 2° C., the current of the bistable resistance element dramatically decreases from about 0.25 mA to 0. Therefore, the $\Delta T_{min}$ is about 2° C., and the bistable resistance element switches from the low resistance state to the high resistance state bidirectionally.

Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A temperature control switch comprising a bistable resistance element, the bistable resistance element comprising:
   a low-conductivity matrix expanding or contracting according to a temperature change; and
   a plurality of high conductivity particles dispersed in the matrix,
   wherein the bistable resistance element is capable of switching from a low resistance state to a high resistance state by increasing a temperature of the bistable resistance element, and is capable of switching from a low resistance state to a high resistance state by decreasing a temperature of the bistable resistance element.

2. The temperature control switch of claim 1, wherein the bistable resistance element switches from the high resistance state to the low resistance state by receiving an electric signal applied to the bistable resistance element.

3. The temperature control switch of claim 2, wherein the electric signal is at least one of a current, a voltage, and an electric field.

4. The temperature control switch of claim 3, wherein an intensity of the electric filed is in a range from about 0.1 V/mm to about 100 V/mm.

5. The temperature control switch of claim 1, wherein a ratio of the high resistance to the low resistance of the bistable resistance element is equal to or larger than 100:1.

6. The temperature control switch of claim 1, wherein the plurality of high conductivity particles are metal particles.

7. The temperature control switch of claim 1, wherein a volume percentage of the metal particles in the bistable resistance element is in a range from about 5% to about 40%.

8. The temperature control switch of claim 1, wherein a diameter of the metal particles is in a range from about 2 nanometers to 20 microns.

9. The temperature control switch of claim 1, wherein at the low resistance state, the bistable resistance element further comprises a plurality of high conductivity filaments extending from surfaces of the plurality of high conductivity particles.

10. The temperature control switch of claim 9, wherein at the high resistance state, at least some of the plurality of conductivity filaments are isolated or broken to electrically disconnect the high conductivity particles.

11. The temperature control switch of claim 1, wherein a material of the matrix is polydimethyl siloxane, the plurality of high conductivity particles are nickel particles, a diameter of the nickel particles is from about 1 micron to about 6 microns, and a volume percentage of the nickel particles in the bistable resistance element is in a range from about 9% to about 11%.

12. The temperature control switch of claim 2 further comprising an electric excitation element to produce the electric signal.

13. The temperature control switch of claim 12 further comprising two electrodes electrically connecting the electric excitation element to the bistable resistance element.

14. The temperature control switch of claim 1 further comprising a temperature excitation element to cause the temperature change.

15. The temperature control switch of claim 1, wherein the matrix is organic and soft.

16. A method for using a temperature control switch comprising steps of:
   providing the temperature control switch comprising a bistable resistance element, the bistable resistance element comprising a low-conductivity matrix and a plurality of high conductivity particles dispersed in the matrix;
   applying an electric signal to the bistable resistance element to change the bistable resistance element from a high resistance state to a low resistance state if the bistable resistance element is at the high resistance state; and
   sensing a temperature change by switching the low resistance state to a high resistance state of the bistable resistance element.

17. The method of claim 16, further comprising applying the electric signal to the bistable resistance element to switch the bistable resistance element to the low resistance state.

18. The method of claim 16, wherein on different times of switches, a temperature of the bistable resistance element at the low resistance state has the same value.

19. An alarm system comprising:
   a temperature control switch comprising a bistable resistance element, the bistable resistance element comprising a low-conductivity matrix and a plurality of high conductivity particles dispersed in the matrix, wherein the bistable resistance element is capable of switching from a low resistance state to a high resistance state by increasing a temperature of the bistable resistance element, and is capable of switching from a low resistance state to a high resistance state by decreasing a temperature of the bistable resistance element;
   an alarming circuit; and
   an alarm;
   wherein the temperature control switch and the alarm are electrically connected with the alarming circuit, and the alarming circuit powers the alarm if the bistable resistance element is at a high resistance state.

* * * * *